US012237584B2

(12) United States Patent
Fan et al.

(10) Patent No.: US 12,237,584 B2
(45) Date of Patent: Feb. 25, 2025

(54) CONTROL DEVICE FOR ANTENNA, CONTROL METHOD FOR ANTENNA, ANTENNA SYSTEM AND COMPUTING CONTROL DEVICE

(71) Applicants: Beijing BOE Technology Development Co., Ltd., Beijing (CN); BOE Technology Group Co., Ltd., Beijing (CN)

(72) Inventors: Xichao Fan, Beijing (CN); Zongmin Liu, Beijing (CN); Wei Li, Beijing (CN); Junwei Guo, Beijing (CN); Feng Qu, Beijing (CN); Biqi Li, Beijing (CN); Yali Wang, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 331 days.

(21) Appl. No.: 17/780,019

(22) PCT Filed: Jun. 23, 2021

(86) PCT No.: PCT/CN2021/101894
§ 371 (c)(1),
(2) Date: May 25, 2022

(87) PCT Pub. No.: WO2022/266900
PCT Pub. Date: Dec. 29, 2022

(65) Prior Publication Data
US 2022/0416418 A1 Dec. 29, 2022

(51) Int. Cl.
*H01Q 3/00* (2006.01)
*H01Q 3/26* (2006.01)
(Continued)

(52) U.S. Cl.
CPC ............ *H01Q 3/267* (2013.01); *H01Q 3/36* (2013.01); *G01R 29/0871* (2013.01); *H01Q 3/30* (2013.01);
(Continued)

(58) Field of Classification Search
CPC ............ H01Q 3/26; H01Q 3/267; H01Q 3/30; H01Q 3/36; H04B 7/18517; H04B 7/18513
(Continued)

(56) References Cited

U.S. PATENT DOCUMENTS 6,023,242 A 2/2000 Dixon
6,640,085 B1 10/2003 Chatzipetros et al.
(Continued)

FOREIGN PATENT DOCUMENTS

CN 111130627 A 5/2020
CN 112886995 A 6/2021
(Continued)

*Primary Examiner* — Chuong P Nguyen
(74) *Attorney, Agent, or Firm* — Ling Wu; Stephen Yang; Ling and Yang Intellectual Property

(57) ABSTRACT

Device and method controlling for an antenna, an antenna system and a computing control device are provided. The antenna includes multiple antenna array elements and multiple phase shifters for calibrating phases of the multiple antenna array elements. The device includes a temperature sensor, a positioning unit and a computing control unit, the temperature sensor is configured to obtain temperature information of the antenna and output it to the computing control unit; the positioning unit is configured to obtain position information of the antenna and output it to the computing control unit; the computing control unit is configured to receive the position information and temperature information of the antenna, determine position information of a satellite, and control the phase shifters to adjust phases of the multiple antenna array elements according to the position information the temperature information of the antenna, the (Continued)

position information of the satellite and pre-stored calibration data.

11 Claims, 11 Drawing Sheets

(51) Int. Cl.
    *H01Q 3/36*     (2006.01)
    *G01R 29/08*     (2006.01)
    *H01Q 3/30*     (2006.01)
    *H04B 7/185*     (2006.01)

(52) U.S. Cl.
    CPC ...... *H04B 7/18513* (2013.01); *H04B 7/18517* (2013.01)

(58) Field of Classification Search
    USPC .......................................................... 342/372
    See application file for complete search history.

(56) References Cited

U.S. PATENT DOCUMENTS

| | | | | |
|---|---|---|---|---|
| 7,768,453 | B2 * | 8/2010 | Mason | H01Q 3/267 |
| | | | | 342/368 |
| 10,096,899 | B2 * | 10/2018 | Renard | H01Q 3/267 |
| 10,720,702 | B2 * | 7/2020 | Chou | H01Q 3/267 |
| 11,411,663 | B2 * | 8/2022 | Motoi | H04B 7/08 |
| 2002/0093453 | A1 * | 7/2002 | Vail | H01Q 3/267 |
| | | | | 342/372 |
| 2021/0367338 | A1 * | 11/2021 | Suzuki | H01P 1/30 |

FOREIGN PATENT DOCUMENTS

| | | | | |
|---|---|---|---|---|
| CN | 112909552 A | | 6/2021 | |
| CN | 110176965 B | * | 7/2021 | ............. H04B 17/12 |
| CN | 117289503 A | * | 12/2023 | ............. G02F 1/133 |

* cited by examiner

CONTROL DEVICE FOR ANTENNA, CONTROL METHOD FOR ANTENNA, ANTENNA SYSTEM AND COMPUTING CONTROL DEVICE

CROSS-REFERENCE TO RELATED APPLICATION

The present disclosure is a U.S. National Phase Entry of International Application PCT/CN2021/101894 having an international filing date of Jun. 23, 2021, and the contents disclosed in the above-mentioned application are hereby incorporated as a part of this application.

TECHNICAL FIELD

Embodiments of the present disclosure relate to but are not limited to the field of display technology, in particular to a control device for an antenna, a control method, an antenna system and a computing control device.

BACKGROUND

A phased array antenna refers to an antenna whose shape of pattern is changed by controlling a feed phase of a radiation unit in the array antenna. A direction of a maximum value of an antenna pattern may be changed by controlling a phase to achieve a purpose of beam scanning. The phased array antenna is widely applied, for example, it may be applied to communication between vehicles and satellites, array radars for unmanned driving, or security array radars.

A conventional phased array antenna has some problems such as high price, high profile and difficulty in heat dissipation. In order to overcome these problems, liquid crystal phased array antenna is introduced. The liquid crystal phased array antenna has features such as high working frequency, good heat dissipation, light weight, small size, breakdown resistance and low cost. However, the liquid crystal phased array antenna system also has some problems, such as serious loss, poor anti-vibration ability and poor adaptability to low temperatures.

SUMMARY

The following is a summary of subject matters described herein in detail. This summary is not intended to limit the scope of protection of claims.

An embodiment of the present disclosure provides a control device for an antenna, the antenna including multiple antenna array elements and multiple phase shifters for phase calibration of the multiple antenna array elements, wherein the control device includes a temperature sensor, a positioning unit and a computing control unit, wherein the temperature sensor is configured to acquire temperature information of the antenna and output the temperature information to the computing control unit; the positioning unit is configured to acquire position information of the antenna and output the position information to the computing control unit; the computing control unit is configured to receive the position information and the temperature information of the antenna, determine position information of a satellite, and control the phase shifters to adjust phases of the multiple antenna array elements according to the position information and the temperature information of the antenna, the position information of the satellite and pre-stored calibration data.

In an exemplary embodiment, the control device further includes a coupler and a signal processing unit, wherein the coupler is configured to output a signal received by the antenna to the signal processing unit; the signal processing unit is configured to process the signal received by the antenna to obtain an intermediate signal; the computing control unit is further configured to compute a gain of the intermediate signal, determine whether the gain of the intermediate signal is less than or equal to a first gain threshold, and control the phase shifters to finely adjust the phases of the multiple antenna array elements if the gain is less than or equal to the first gain threshold.

In an exemplary embodiment, the coupler is a power divider or a microstrip line coupled to a receiving link that connects the antenna to an external receiving terminal, one end of the microstrip line is connected to a ground resistance, and the other end of the microstrip line is connected to the signal processing unit.

In an exemplary embodiment, the microstrip line has a periodic cosine or sinusoidal structure.

In an exemplary embodiment, the signal processing unit includes a filter, a mixer and an analog-to-digital converter, wherein the filter is configured to filter the signal received by the antenna; the mixer is configured to mix an output signal of the filter with a signal provided by a local oscillator; and the analog-to-digital converter is configured to perform analog-to-digital conversion on an output signal of the mixer to generate the intermediate signal.

In an exemplary embodiment, the control device further includes at least one of a heating module and a cooling module; the computing control unit is further configured to determine a calibration temperature of the antenna according to the temperature of the antenna, and control at least one of the heating module and the cooling module to adjust the temperature of the antenna to the determined calibration temperature when the temperature of the antenna is not the determined calibration temperature; the heating module is configured to heat the antenna under control of the computing control unit; and the cooling module is configured to cool the antenna under control of the computing control unit.

In an exemplary embodiment, the pre-stored calibration data includes multiple sets of test data, and each set of test data includes a correspondence between one set of emission source positions, the temperature of the antenna, and a phase calibration value of the antenna.

In an exemplary embodiment, operation of controlling the phase shifters to adjust the phase of the multiple antenna array elements according to the position information and the temperature information of the antenna, the position information of the satellite and the pre-stored calibration data, includes: determining a corresponding emission source position in the calibration data according to the position information of the antenna and the position information of the satellite, determining a corresponding set of test data according to the corresponding emission source position and the temperature information of the antenna; and controlling the phase shifters to adjust the phase of the multiple antenna array elements according to the corresponding test data.

In an exemplary embodiment, the satellite is located at a position C and the antenna is located at a position B2. Determining the corresponding emission source position in the calibration data according to the position information of the antenna and the position information of the satellite includes: taking a longitudinal first straight line segment from the position C, taking a transverse second straight line segment from the position B2, wherein the first straight line segment and the second straight line segment intersect at a position A2; determining a position A1 on a straight line CA2 with a distance from the position C being equal to a calibration plane height, wherein the calibration plane height is equal to a distance between a plane at which multiple emission sources are located and the position of the antenna during calibration; and taking a transverse third straight line segment from the position A1, the third straight line segment and a straight line CB2 intersecting at a position B1, then the position B1 is the corresponding emission source position in the calibration data.

In an exemplary embodiment, the computing control unit is a field programmable gate array (FPGA) chip.

An embodiment of the present disclosure further provides an antenna system including an antenna and the control device for an antenna as described in any one of the preceding embodiments.

An embodiment of the present disclosure further provides a control method for an antenna, the antenna including multiple antenna array elements and multiple phase shifters for calibrating phases of the multiple antenna array elements, wherein the control method includes: receiving position information and temperature information of an antenna and determining position information of a satellite; and adjusting phases of the multiple antenna array elements according to the position information and the temperature information of the antenna, the position information of the satellite and pre-stored calibration data.

An embodiment of the present disclosure further provides a computing control device, including a memory and a processor, wherein the memory is configured to store program instructions and calibration data; the processor is configured to invoke the program instructions stored in the memory and execute the following steps according to the obtained program: receiving position information and temperature information of an antenna and determining position information of a satellite; and adjusting phases of the multiple antenna array elements according to the position information and the temperature information of the antenna, the position information of the satellite and pre-stored calibration data.

An embodiment of the present disclosure further provides a computer-readable storage medium, which stores program instructions and calibration data, wherein when the program instruction is executed, the following steps may be implemented: receiving position information and temperature information of an antenna, and determining position information of a satellite; and adjusting phases of the multiple antenna array elements according to the position information and the temperature information of the antenna, the position information of the satellite and pre-stored calibration data.

Other aspects may be comprehended upon reading and understanding of the drawings and detailed descriptions.

BRIEF DESCRIPTION OF DRAWINGS

Accompanying drawings are used for providing further understanding of technical solutions of the present disclosure, constitute a part of the specification, and are used for explaining the technical solutions of the present disclosure together with the embodiments of the present disclosure but not to constitute limitations on the technical solutions of the present disclosure. Shapes and sizes of various components in the accompanying drawings do not reflect actual scales and are only intended to illustrate contents of the present disclosure.

DETAILED DESCRIPTION

Embodiments of the present disclosure will be described in detail below in combination with the drawings. It is to be noted that implementation modes may be implemented in multiple different forms. Those of ordinary skills in the art can easily understand such a fact that implementation modes and contents may be transformed into various forms without departing from the purpose and scope of the present disclosure. Therefore, the present disclosure should not be interpreted as being limited to the contents recorded in the following implementations only. The embodiments in the present disclosure and features in the embodiments may be randomly combined with each other if there is no conflict.

In this specification, for sake of convenience, wordings indicating directional or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The position relationships between the constituent elements are changed appropriately according to the directions in which the various constituent elements are described. Therefore, description is not limited to the wordings used in the specification, and appropriate substitutions may be made according to situations.

In this specification, unless otherwise specified and defined explicitly, terms "mount", "mutually connect", and "connect" should be understood in a broad sense. For example, it may be a fixed connection, a detachable connection, or an integrated connection, a connection may be a mechanical connection or a connection, and it may be a direct connection, an indirect connection through intermediate components, or internal communication between two components. Those of ordinary skills in the art may understand specific meanings of these terms in the present disclosure according to specific situations.

Figure 1A:
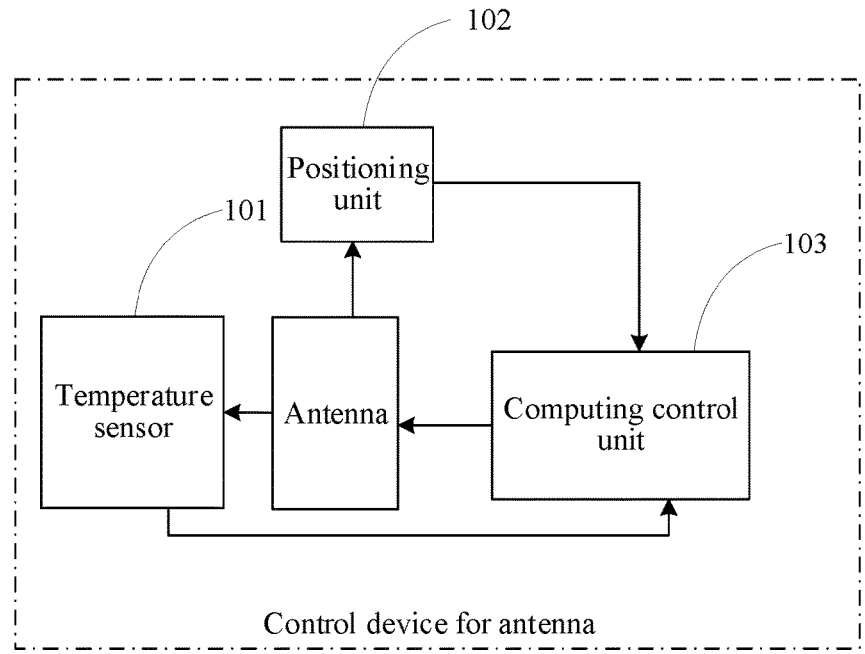
FIGS. 1a, 1b and 1c are schematic diagrams of structures of three control devices for an antenna according to an embodiment of the present disclosure.

As shown in FIG. 1a, an embodiment of the present disclosure provides a control device for an antenna, wherein the antenna includes multiple antenna array elements and multiple phase shifters for calibrating phases of the multiple antenna array elements. The control device includes a temperature sensor 101, a positioning unit 102, and a computing control unit 103.

The temperature sensor 101 is configured to acquire temperature information of the antenna and output the temperature information to the computing control unit 103.

The positioning unit 102 is configured to acquire position information of the antenna and output the position information to the computing control unit 103.

The computing control unit 103 is configured to receive the position information and the temperature information of the antenna, determine position information of a satellite, and control the phase shifters to adjust the phases of the multiple antenna array elements according to the position information and the temperature information of the antenna, the position information of the satellite and pre-stored calibration data.

A current antenna generally uses an external receiving terminal as a control system. However, when most antenna manufacturers produce antennas, external receiving terminals will not be produced at the same time. For antenna manufacturers, it is necessary to control a phase of an antenna in combination with an external receiving terminal. Generally, the external receiving terminal needs to modulate and demodulate satellite data first before controlling the phase of the antenna. Therefore, this phase control scheme is inconvenient to use and needs to occupy resources of external receiving terminals.

The control device provided by the embodiment of the present disclosure solves the problem of phase alignment between liquid crystal phased array antennas and geosynchronous satellites, such that the phases of the phased array antennas may be consistent, receive gain is greatly increased, and signal-to-noise ratios of signals are improved, thereby improving signal quality. Moreover, the liquid crystal moves directionally after a voltage is applied, thus a better anti-vibration effect is achieved. In addition, the control device for an antenna according to the embodiment of the present disclosure may form a negative feedback subsystem, so that a manufacturer of the antenna may autonomously control the phase of the antenna without using an external receiving terminal.

Figure 1B:
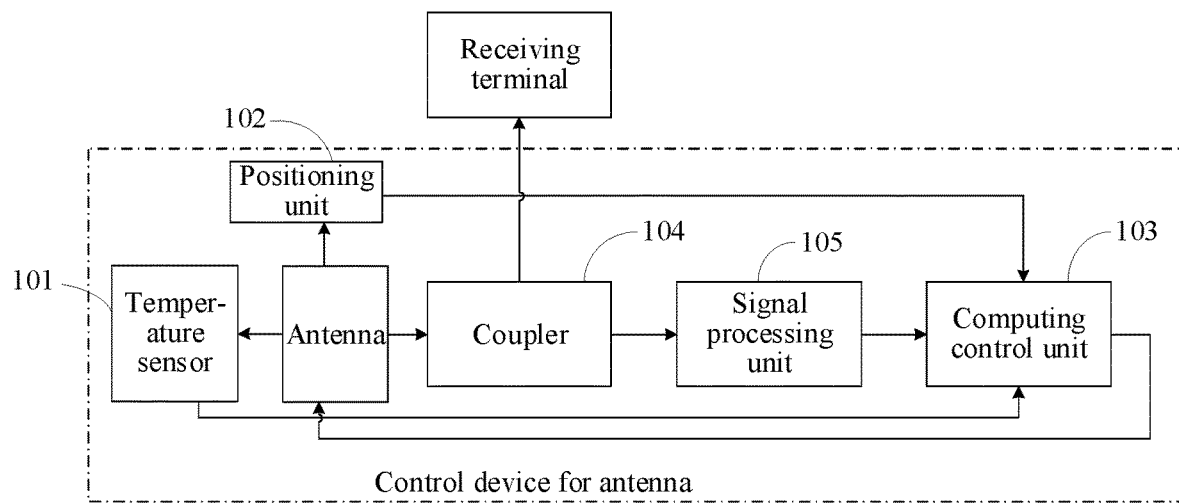

In some exemplary embodiments, as shown in FIG. 1b, the control device may further include a coupler 104 and a signal processing unit 105.

The coupler 104 is configured to output a signal received by the antenna to a signal processing unit 105.

The signal processing unit 105 is configured to process the received signal to obtain an intermediate signal.

The computing control unit 103 is further configured to compute a gain of the intermediate signal, determine whether the gain of the intermediate signal is less than or equal to a first gain threshold, and finely adjust phases of the multiple antenna array elements if the gain is less than or equal to the first gain threshold.

In an exemplary embodiment, the computing control unit 103 may derive the gain of the intermediate signal by computing a measurement integral.

Figure 1C:
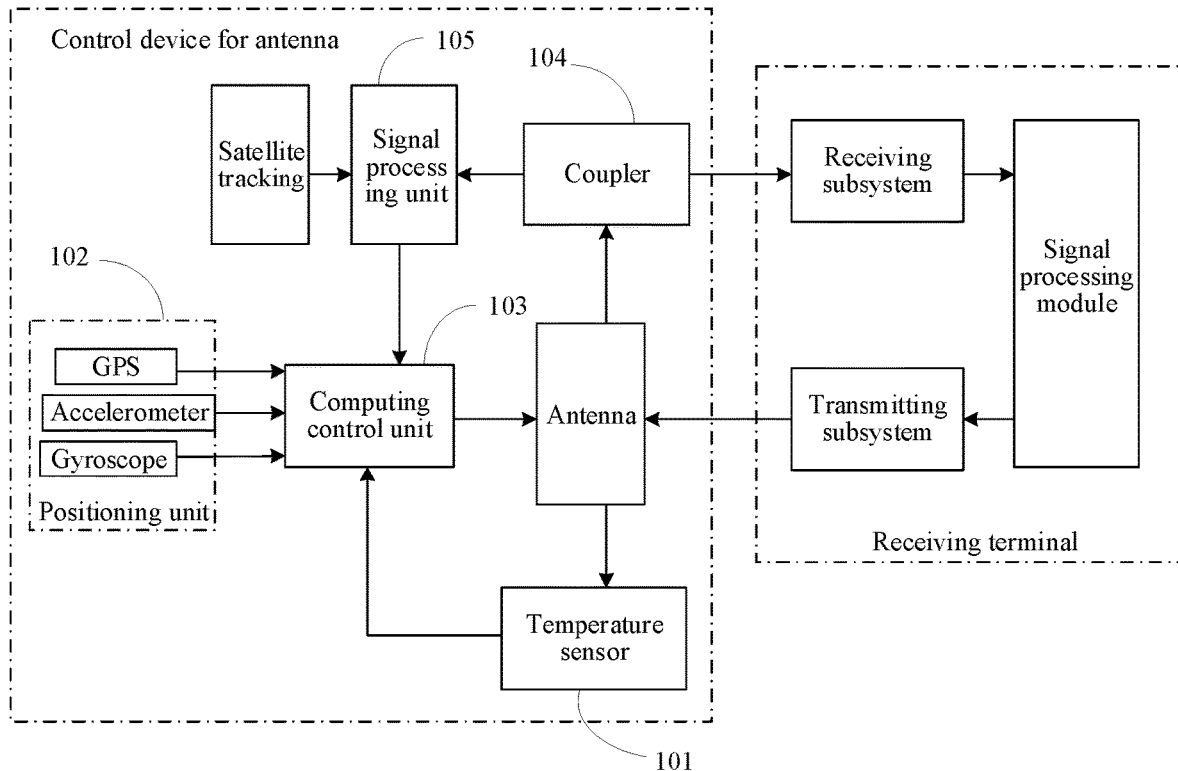

In an exemplary embodiment, as shown in FIG. 1b or FIG. 1c, the coupler 104 is further configured to output the signal received by the antenna to an external receiving terminal. The external receiving terminal may include a transmitting subsystem, a receiving subsystem and an information processing module, which are not limited in the present disclosure and may be arbitrarily provided.

In an exemplary embodiment, as shown in FIG. 1c, the positioning unit 102 may include a global positioning system (GPS), an accelerometer, a gyroscope, etc. The global positioning system (GPS) is a high-precision radio navigation positioning system based on artificial earth satellites, which can provide accurate geographical position, running speed and accurate time information anywhere in the world and in near-earth space. The accelerometer and the gyroscope may capture a motion direction and acceleration data of an antenna in real time according to the position information of the antenna.

In an exemplary embodiment, the computing control unit 103 may determine position information of the satellite based on the position information of the antenna or the pre-stored position information of the satellite.

Figure 2:
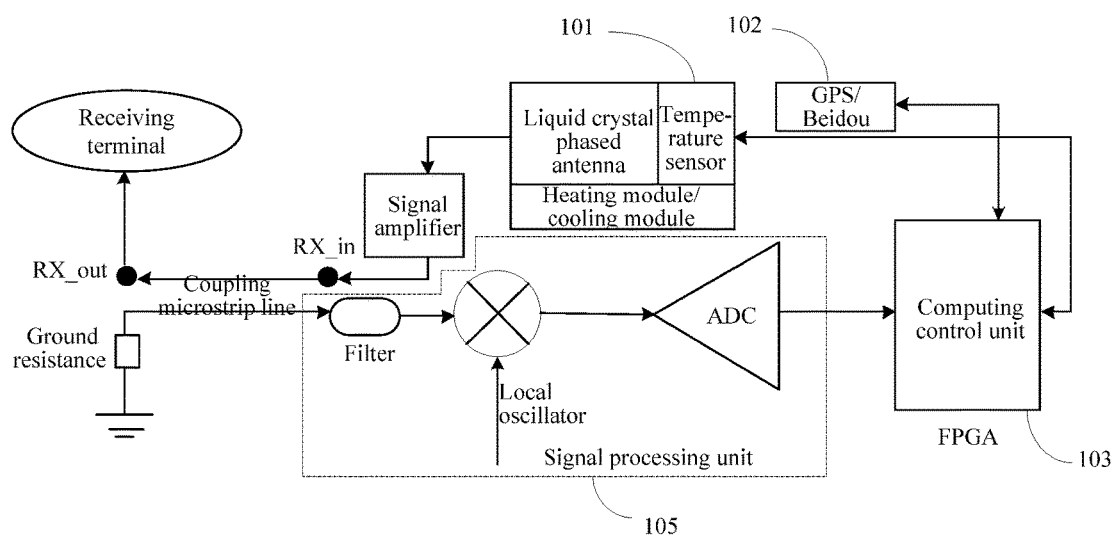
FIG. 2 is a schematic diagram of a structure of another control device for an antenna according to an embodiment of the present disclosure.

In an exemplary embodiment, as shown in FIG. 2, a signal amplifier may be provided between the antenna and a receiving link, and the signal amplifier is configured to amplify and output the signal received by the antenna.

In an exemplary embodiment, the signal amplifier may be a low noise amplifier (LNA) or a low noise block (LNB). A low noise amplifier is a high sensitivity preamplifier, which is usually connected to a feed horn of a ground station antenna to reduce a noise temperature of the receiving system and improve its total gain. A function of the low noise block is to amplify and down-convert satellite signals transmitted by a feed source, and then convert the Ku/KA or C band signals into L band signals, which are transmitted to the satellite receiver via a coaxial cable.

KA band (Ka band) is a satellite communication band that usually uses 17.7 to 20.2 GHz for downlink and 27.5 to 30.0 GHz for uplink, and is often referred to as the 20/30 GHz band. Ku band (Ku-band) is a satellite communication band that usually uses 10.7 to 13.25 GHz for downlink and 14.0 to 14.5 GHz for uplink, and is often called 12/14 GHz band. C band is a frequency band with frequency from 4.0 to 8.0 GHz, which is used as the frequency band for downlink transmission signals of communication satellites. An L-band signal refers to a satellite signal output from a downlink signal (Ku/KA or C-band signal) of a satellite after being subjected to frequency reduction processing by LNB. Its frequency ranges from 950 MHz to 2150 MHz, and it is characterized by high frequency and wide frequency band.

In an exemplary embodiment, the coupler 104 may be a 3 dB coupler, and signals output from two output ports of the 3 dB coupler have equal amplitudes. In other exemplary embodiments, the signals output from the two output ports of the coupler may have unequal amplitudes as well.

In an exemplary embodiment, the coupler 104 may be a power divider. A power divider is a device that divides one path of input signal energy into two or more paths of equal or unequal output energy. A function of the power divider is to equally divide one path of input satellite IF signal into several paths to output the same. The power dividers usually include one-two divider, one-four divider, one-six divider and so on.

In another exemplary embodiment, the coupler 104 may be a microstrip line coupled to a receiving link that is connects an antenna (or signal amplifier) to an external receiving terminal. One end of the microstrip line is connected to a ground resistance (which, for example, may have a resistance value of 50 ohms), and the other end of the microstrip line is connected to a signal processing unit.

Figure 3:
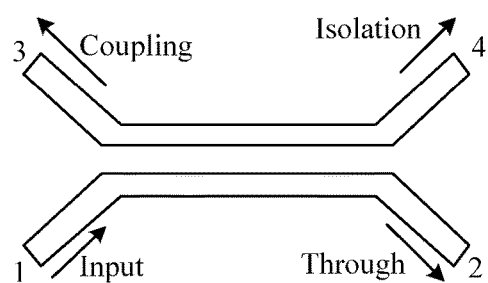
FIG. 3 is a schematic diagram of a structure of a coupler according to an embodiment of the present disclosure.

In this embodiment, the directional coupler is a common microwave/millimeter wave component in microwave measurement and other microwave systems, and may be used for signal isolation, separation and mixing, such as power monitoring, source output power stabilization, isolation of a signal source and sweep-frequency testing of transmission and reflection, etc. It is a directional microwave power divider and an indispensable component in modern sweep-frequency reflectometer, which usually has several types such as waveguide, coaxial line, strip line and microstrip line. As shown in FIG. 3, the directional coupler typically has four ports and two transmission lines. The four ports are: input end, through end, coupling end and isolation end respectively, and the two transmission lines include a main transmission line 1-2 and a secondary transmission line 3-4. When a signal is input from the input end, a part of the signal is transmitted to the through end along the main transmission line 1-2, and a part of the signal is coupled to the secondary transmission line 3-4 through a small hole or a slit. Coupling includes electric field coupling and magnetic field coupling. Current coupled to the secondary transmission line by electric field is transmitted to the coupling end and the isolation end respectively, while the current coupled to the secondary transmission line by magnetic field is transmitted only to the coupling end.

Figure 4:
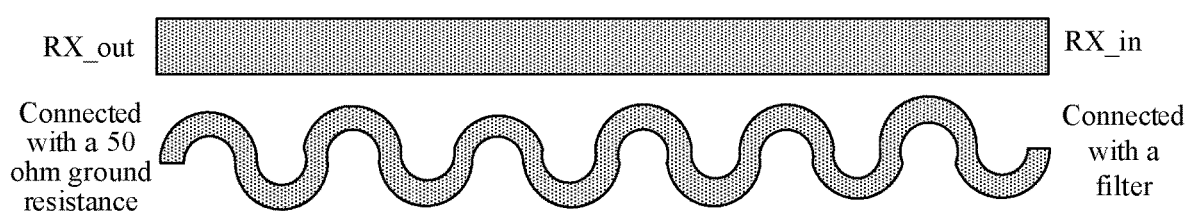
FIG. 4 is a schematic diagram of a structure of a microstrip line according to an embodiment of the present disclosure.

In an exemplary embodiment as shown in FIG. 4, the microstrip line may be of a periodic cosine or sinusoidal structure.

In this embodiment, a microstrip line is a microwave transmission line composed of a single conductor strip supported on a dielectric substrate. A grounded metal plate is manufactured on the other side of the substrate. The two transmission lines, the microstrip line and the receiving link, are placed close enough so that the signals on the receiving link may be coupled to the microstrip line. One end of the microstrip line may be connected to a 50 ohm ground resistance, and the other end of the microstrip line may be connected to a filter.

In an exemplary embodiment as shown in FIG. 2, the signal processing unit 105 may include a filter, a mixer and an analog-to-digital converter.

The filter is configured to filter the signal received by the antenna.

The mixer is configured to mix an output signal of the filter with a signal provided by a local oscillator.

The analog-to-digital converter is configured to perform analog-to-digital conversion on an output signal of the mixer to generate an intermediate signal.

Figure 5:
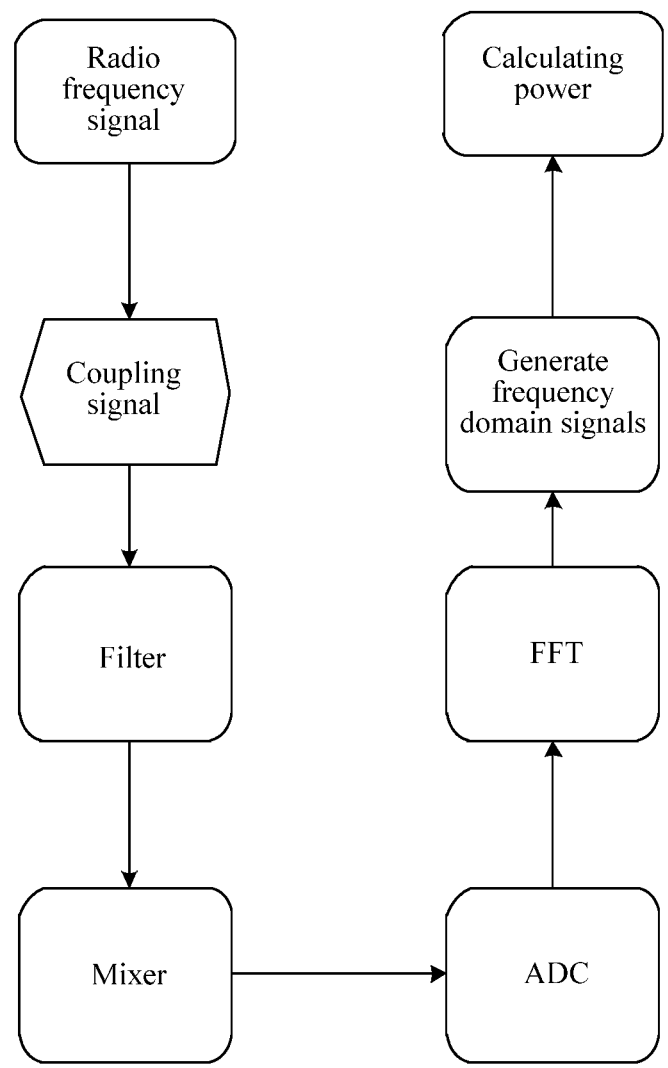
FIG. 5 is a schematic flowchart of signal processing according to an embodiment of the present disclosure.

In an exemplary embodiment, as shown in FIG. 5, the antenna receives a radio frequency signal, and the signal is coupled by the coupler, and enters filters in the receiving terminal and the signal processing unit respectively. Processing on the signal by the receiving terminal is not within the scope of the present disclosure. The filter suppresses signals outside KA band or KU band, and sends signals in KA or KU frequency band to the mixer. Under the action of the local oscillator, the signal is lowered to an appropriate intermediate frequency, and output to the analog-to-digital converter (ADC). The ADC including a zero intermediate frequency receiving system may convert an analog signal into a digital signal, and then output the digital signal to the computing control unit. The computing control unit transforms the digital signal into frequency domain signal by fast Fourier transform (FFT), and then computes power spectral density (P SD) of the frequency domain signal, so as to obtain power of the received signal. A power spectral density of a signal refers to power carried by the wave per unit frequency obtained when the power spectral density of the wave is multiplied by an appropriate coefficient.

In an exemplary embodiment, the computing control unit 103 may be a field programmable gate array (FPGA) chip. FPGA is a type of semi-custom circuit in an application specific integrated circuit, and it is a programmable logic array, which can effectively solve the problem that the number of gate circuits in an existing device is small. FPGA appears as a semi-custom circuit in the field of application specific integrated circuit (ASIC), which not only solves the shortage of custom circuit, but also overcomes the shortcoming of the limited number of gates circuits of existing programmable devices.

In an exemplary embodiment, the antenna may be a liquid crystal phased array antenna that includes multiple antenna elements and a liquid crystal phase shifter for calibrating phases of the antenna elements.

Liquid crystal is a kind of material whose dielectric constant may be controlled by applying voltage. With different applied bias voltage, the dielectric constant may be changed continuously, and then the continuous phase shift may be adjusted. Liquid crystal phase shifter is a new type of phase shifter currently being studied by scholars all over the world, which has broad application prospects in microwave and millimeter wave bands.

In this embodiment, an antenna array element is used for receiving/transmitting radio frequency signals, and may include a radiating unit and a receiving unit, wherein the radiating unit is used for transmitting radio frequency signals and the receiving unit is used for receiving radio frequency signals. The liquid crystal phased array antenna further includes a liquid crystal phase shifter for calibrating the phase of each antenna array element. Liquid crystal molecules in a liquid crystal layer of the liquid crystal phase shifter are anisotropic and exhibit different dielectric constants in a long axis direction and a short axis direction. When a radio frequency signal is transmitted along a transmission line in a liquid crystal layer having a changed dielectric constant, the phase of the radio frequency signal is shifted to some extent. Thus, the phase shift of the radio frequency signal may be achieved by controlling deflection of the liquid crystal molecules in the liquid crystal layer, and the deflection may in turn be achieved by controlling a modulation voltage applied to an electrode structure.

In an exemplary embodiment as shown in FIG. 2, the control device may further include at least one of a heating module and a cooling module.

The computing control unit 103 may further be configured to determine a calibration temperature of the antenna according to a temperature of the antenna, and control the heating module or the cooling module to adjust the temperature of the antenna to the determined calibration temperature when the temperature of the antenna is not the determined calibration temperature.

The heating module is configured to heat the antenna under the control of the computing control unit.

The cooling module is configured to cool the antenna under the control of the computing control unit.

Figure 6:
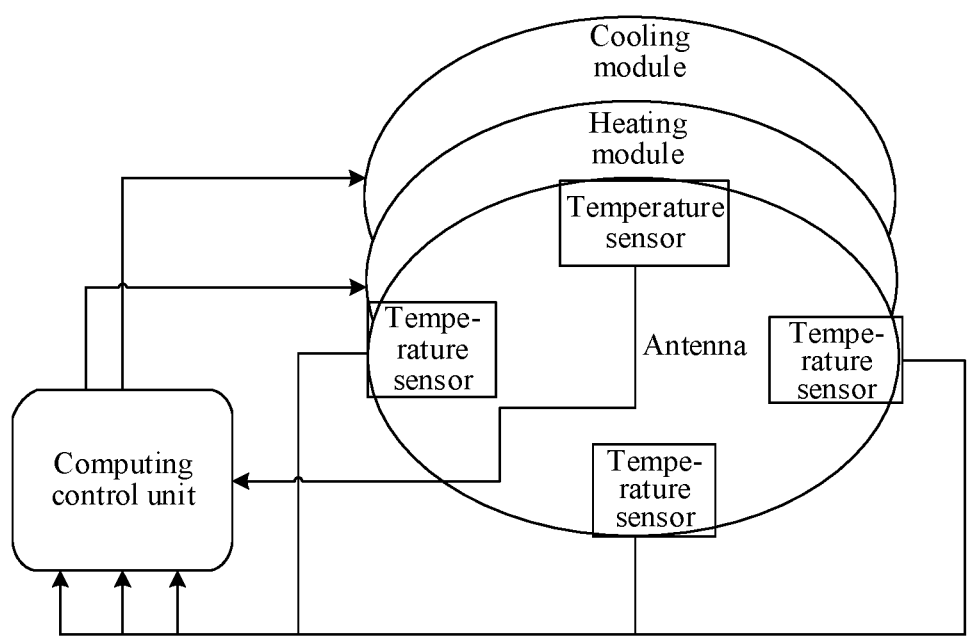
FIG. 6 is a schematic diagram of a temperature control principle of an antenna according to an embodiment of the present disclosure.

Because the liquid crystal is sensitive to temperature, it will be frozen at a low temperature. Therefore, in some exemplary embodiments, as shown in FIG. 6, the control device of the embodiment of the present disclosure may further include a heating module configured to heat the liquid crystal when the temperature of the liquid crystal is too low, and heat the liquid crystal to a high temperature state when it is normally used. In other exemplary embodiments, as shown in FIG. 6, the control device may further include a cooling module configured to reduce heating power to stabilize the liquid crystal to an appropriate temperature when the temperature of the liquid crystal is too high.

The control device of the embodiment of the present disclosure may set the whole antenna in a constant temperature environment by the heating module and the cooling module, which can effectively avoid the influence of temperature on the state of the liquid crystal, thereby solving the problem of poor low temperature adaptability of the liquid crystal phased array antenna system. In an embodiment of the present disclosure, fluidity of the liquid crystal is affected by thermal stress and electric stress, therefore, the phase control is more accurate and can reach the criterion of 1 degree, which plays an important role in phase alignment.

Exemplarily, the number of the antenna array elements may be 64 or any other number.

In an exemplary embodiment, the pre-stored calibration data may include multiple sets of test data, and each set of test data includes a correspondence between one set of emission source positions, a temperature of the antenna, and a phase calibration value of the antenna.

Figure 7:
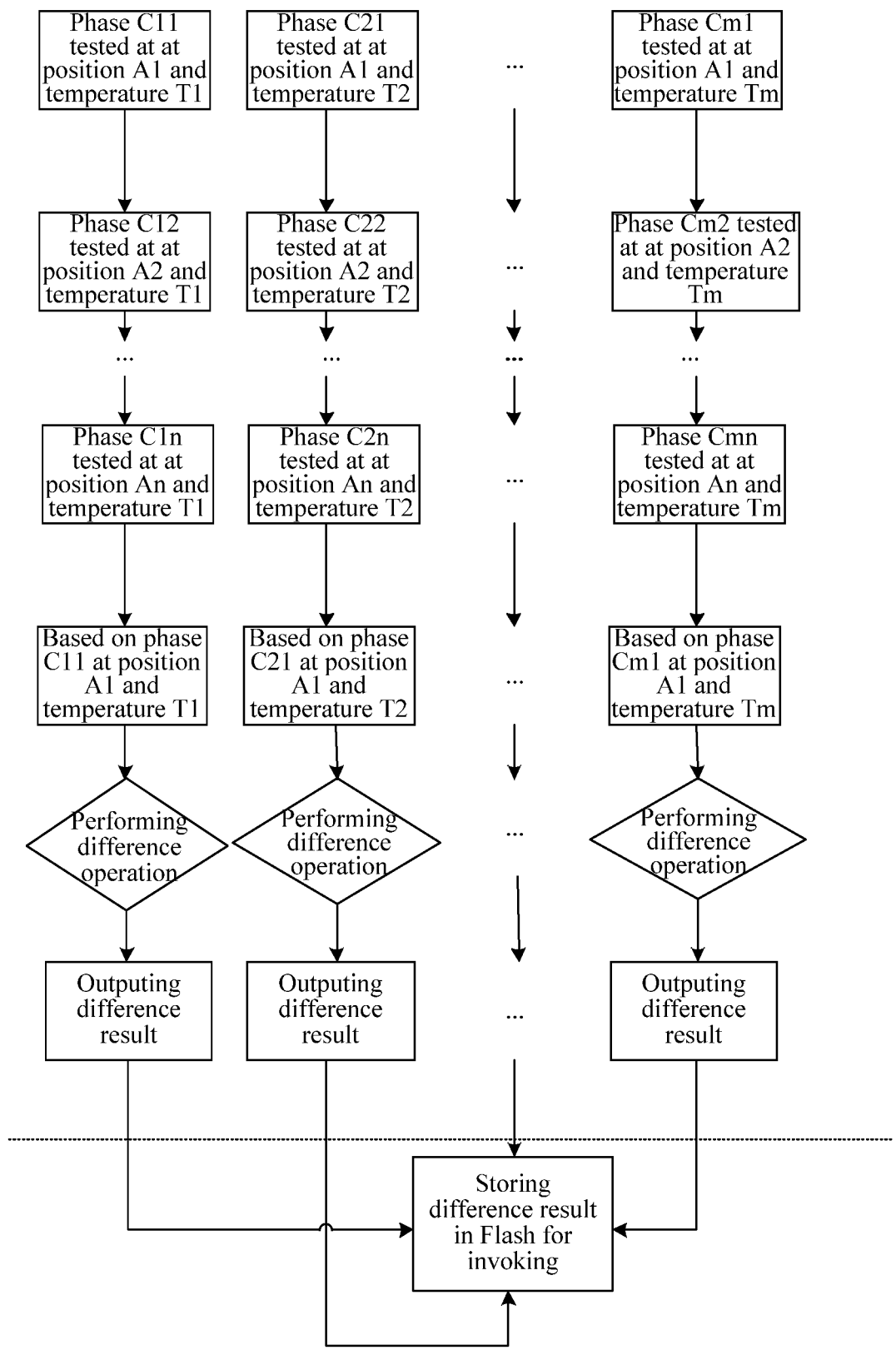
FIG. 7 is a schematic diagram of a calibration process of an antenna according to an embodiment of the present disclosure.

In an exemplary embodiment, as shown in FIG. 7, the pre-stored calibration data may be acquired in the following manner:

In a calibration stage, in a microwave darkroom, an ambient temperature around the antenna is reduced to below −20° C., and the antenna is heated to an appropriate temperature according to the ambient temperature around the antenna. The temperature of the antenna is recorded as T1, for example, it may be −20° C. Then normal antenna calibration is started. All liquid crystal phase shifters are not loaded with voltage, an emission source is placed at position A1 and transmits a signal, and corresponding phases of all antenna elements are tested and recorded as C11. Assuming that the antenna has 64 antenna elements, then C11=(C111, C112, . . . , C1164), wherein C111, C112, . . . , C1164 respectively correspond to the phases of the 64 antenna elements obtained by testing when the temperature is T1 and the emission source is at position A1. Then the emission sources is sequentially placed in other n−1 preset positions A2 to An in different azimuths, and the corresponding phases of all the antenna elements are tested in the same way, and recorded as C12 to C1n, C12=(C121, C122, . . . , C1264), wherein C121, C122, . . . , C1264 respectively correspond to the phases of the 64 antenna elements obtained by testing when the temperature is T1 and the emission source is at position A2, . . . , C1n=(C1n1, C1n2, . . . , C1n64), C1n1, C1n2, . . . , C1n64 respectively correspond to the phases of the 64 antenna elements obtained by testing when the temperature is T1 and the emission source is at position An, where n is a natural number.

For C11 to C1n, following operations are performed respectively: a difference operation is performed on all tested phases with a certain phase value used as a basis (C1i, for example, may be based on C1i1 or any other phase value, e.g. 0, where i is a natural number between 1 and n), and the difference result is stored as calibration data.

Exemplarily, if 0 is used as the basis, the recorded calibration data may be (A1, T1, −C11), (A1, T1, −C12), . . . , (A1, T1, −C1n), where-C11=(−C111, −C112, . . . , −C1164), −C12=(−C121, −C122, . . . , −C1264), −C1n=(−C1n1, −C1n2, −C1n64). Since the original phase is C11, C12, . . . or C1n, a phase of the signal entering the end of the microstrip line RX_in will be C11-C11, C12-C12, . . . or C1n-C1n, that is, 0, the effect of phase alignment is achieved, that is, (A1, T1, −C11), (A1, T1, −C12), . . . , (A1, T1, −C1n) each constitute one set of calibration data that may be invoked by the computing control unit when in use.

Then, calibration data corresponding to different emission source positions at temperatures T2 to Tm are obtained and stored by the same method, where m is a natural number. Exemplarily, the values of T1 to Tm may range between −20° C. and 60° C., with a step value of 10° C. In the calibration phase, sufficient emission source positions and sufficient temperature values may be set.

In an exemplary embodiment, the operation of controlling the phase shifters to adjust the phases of the multiple antenna array elements according to the position information and the temperature information of the antenna, the position information of the satellite and the pre-stored calibration data includes:

determining a corresponding emission source position in the calibration data according to the position information of the antenna and the position information of the satellite;

determining a corresponding set of test data according to the determined corresponding emission source position and the temperature information of the antenna; and controlling the phase shifters to adjust the phases of the multiple antenna elements according to the corresponding test data.

Figure 8:
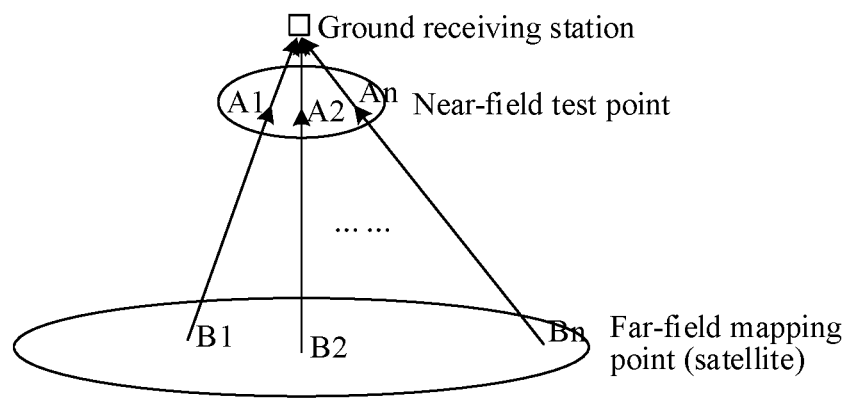
FIG. 8 is a schematic diagram of a calibration principle according to an embodiment of the present disclosure.
Figure 9:
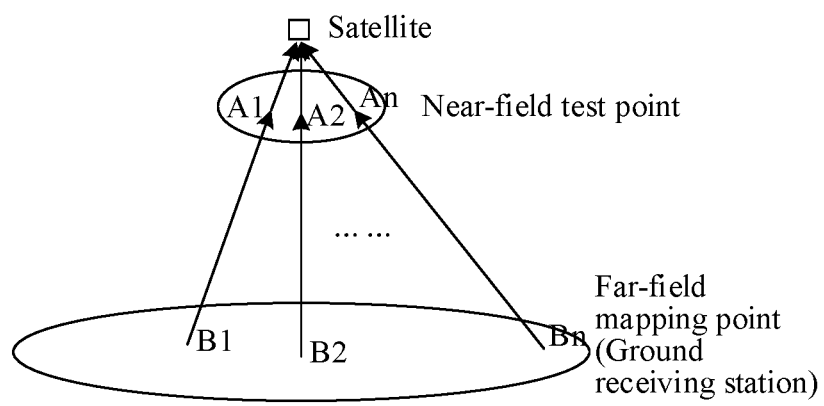
FIG. 9 is a schematic diagram of a receiving direction of an antenna during motion of a ground receiving station, according to an embodiment of the present disclosure.

Since receiving and emitting are reciprocal, change of the relative position between the receiving end and the emitting end will not cause signal phase to change. As shown in FIGS. 8 and 9, the calibrated emission source may be regarded as a ground receiving station, and a far-field mapping point may be regarded as a satellite. Then, when the ground receiving station moves, the satellite keeps still, the position of the ground receiving station is obtained by the positioning unit, the geosynchronous satellite has a fixed position, then the azimuth maps of the ground receiving station and the geosynchronous satellite are also fixed, which have a one-to-one correspondence with a position for near-field calibration. When the position and temperature of the antenna are fixed, they correspond to one set of calibration data Cji, where j is a natural number between 1 and m, and i is a natural number between 1 and n, and this set of calibration data Cji will make the phase of the phased array antenna align.

Figure 10:
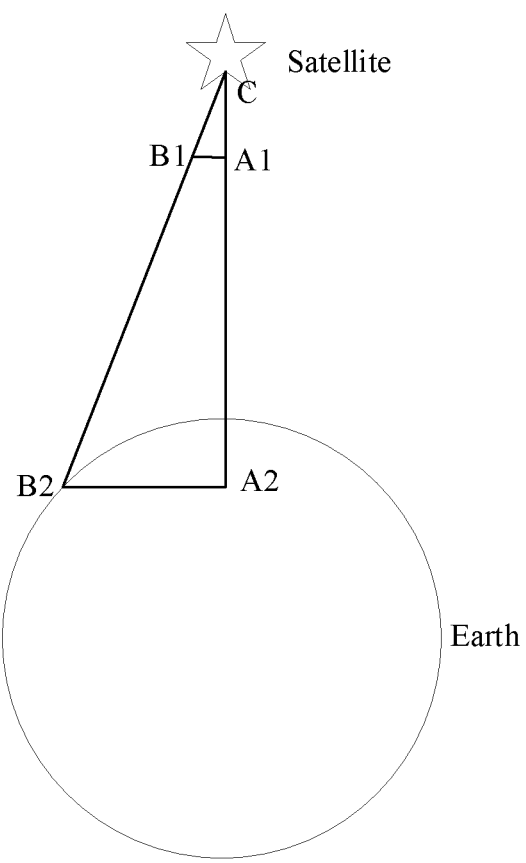
FIG. 10 is a schematic diagram of a mapping method of a ground receiving station according to an embodiment of the present disclosure.

The method of determining the corresponding emission source position in the calibration data is as follows: as shown in FIG. 10, since the satellite is a ground synchronous receiving satellite, the position C of the satellite is certain, the position B2 of the antenna is obtained through positioning by the positioning unit. Since CA2 is perpendicular to B2A2, the position A2 may be determined accordingly. A length of CA1 is equal to a distance from a calibration plane (that is, a plane where the preset positions A1 to An in different azimuths are located) to the antenna during the calibration. A ray perpendicular to CA2 from point A1 is made, and then connected to CB2. It can be known that CB2 intersects with the ray made from point A1 at point B1. Point B1 is the corresponding emission source position in the determined calibration data. The phase alignment of the multiple antenna array elements may be achieved by invoking the calibration data corresponding to the current temperature of the antenna at point B1.

The control device in this embodiment is designed to control the phase of the antenna in m temperature modes in order to reduce unnecessary heat loss. In an exemplary embodiment, the antenna of the embodiment of the present disclosure may operate in an environment of −50° C. to 105° C. Since a condensation temperature of liquid crystal is generally −20° C., and the liquid crystal will not work below this temperature. When the temperature of the antenna read by the temperature sensor is lower than −20° C., the antenna may be heated to −20° C. by the heating module, i.e., to make the temperature of the temperature sensor of the antenna be −20° C. Since the temperature of the environment is constantly changing, the temperature sensor constantly reads the temperature of the liquid crystal, and constantly changes the heating power of the heating module to stabilize the temperature at −20° C. The position of the antenna positioned by the positioning unit, and a set of calibration data is invoked to control the phase of the antenna according to the position and temperature of the antenna, so as to maximize the gain of the antenna.

In an exemplary embodiment, the temperature of the liquid crystal may be raised to −20° C. when the temperature of the antenna is lower than −20° C. When the temperature of the antenna is greater than −20° C. and less than −10° C., the temperature of the liquid crystal may be raised to −10° C. When the temperature of the antenna is greater than −10° C. and less than 0° C., the temperature of the liquid crystal may be raised to 0° C. When the temperature of the antenna is between 0° C. and 60° C., the temperature of liquid crystal may be controlled to the closest value that is a multiple of ten, between 10° C. and 60° C. When the temperature of the antenna is higher than 60° C., the temperature of the antenna may be reduced to 60° C. through the cooling module, which may prevent damages to the phase control circuit system due to an excessively high temperature.

Figure 11:
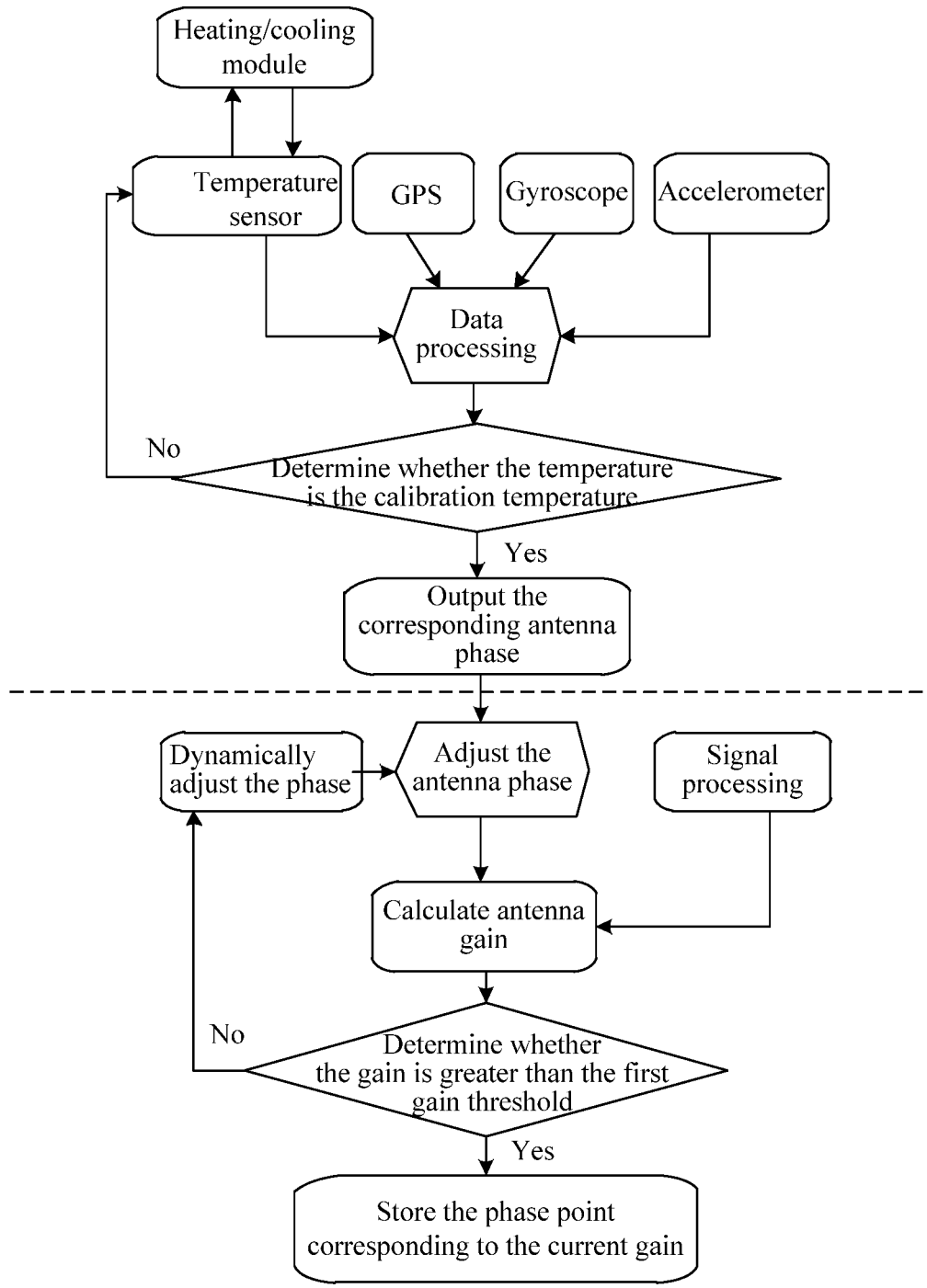
FIG. 11 is a schematic flowchart of antenna phase control according to an embodiment of the disclosure.

During use the control device of the embodiment of the present disclosure, the antenna is placed in a plane, and there is no need to perform operations of alignment and star finding. As shown in FIG. 11, the temperature of the antenna is obtained by the temperature sensor. It is determined whether the temperature of the antenna is the calibrated temperature. If not, the temperature of the antenna is adjusted through the heating module or the cooling module. The position of the antenna is obtained through the positioning unit, and then a corresponding set of calibration data is obtained according to the position information and temperature information of the antenna and the position information of the satellite. According to the corresponding calibration data, the phase of the antenna is adjusted. The signal processing unit processes the signal received by the antenna to obtain the intermediate signal. The control device computes a gain of the intermediate signal and determines whether the gain of the intermediate signal is greater than or equal to a first gain threshold. If not, the phase of the antenna is dynamically finely adjusted, for example, the phases of multiple antenna array elements are adjusted one by one by one or two degrees until the gain of the intermediate signal is greater than or equal to the first gain threshold. The control device of the embodiment of the present disclosure may automatically adjust the phase of the antenna according to the position of the antenna and the temperature of the antenna, so that an azimuth angle of a main lobe of the antenna is aligned with the satellite and the gain is maximized.

Figure 12:
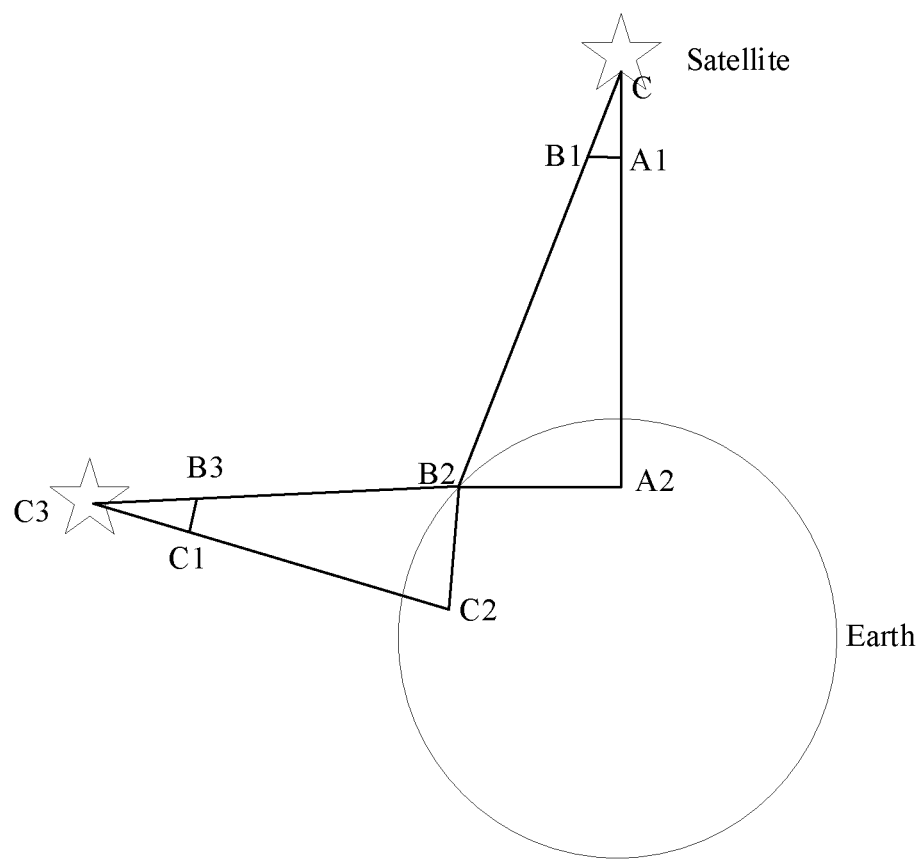
FIG. 12 is a schematic diagram of a mapping method for a set of calibration data corresponding to multiple satellites according to an embodiment of the present disclosure.

As shown in FIG. 12, when there are multiple satellites, the antenna may invoke calibration data corresponding to a position of the currently used satellite according to positions of the multiple satellites, so that the phases of the multiple antenna array elements are consistent.

Figure 13:
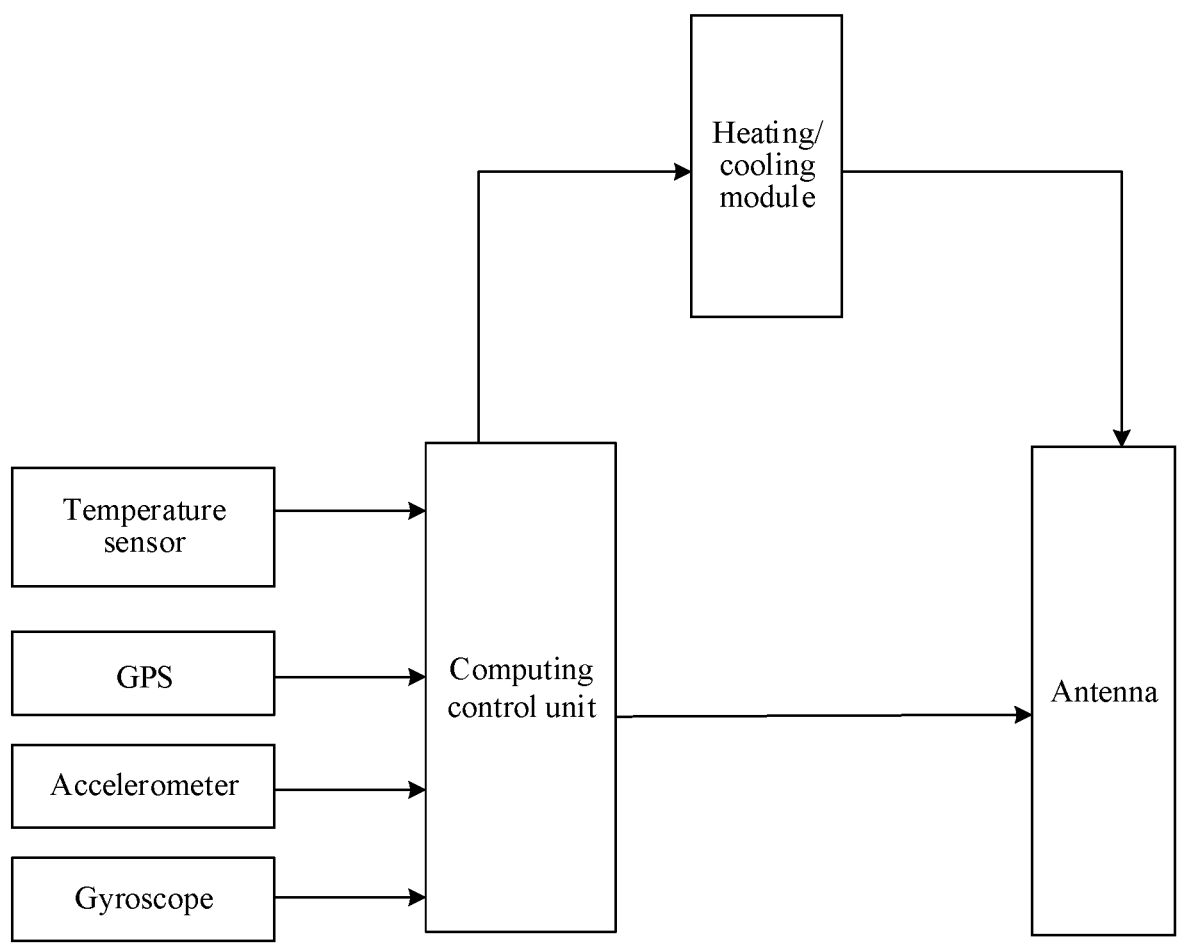
FIG. 13 is a schematic diagram of a structure of another control device for an antenna according to an embodiment of the present disclosure.

As shown in FIG. 13, the control device of the embodiment of the present disclosure may also control the antenna using an open-loop mode. When the open-loop mode is used for antenna control, the control device first reads the position and the temperature of the antenna. The position of the antenna may be located by GPS, and the temperature of the antenna is read out by the temperature sensor. Acceleration at this moment is read by an accelerometer. Azimuth, level, position, velocity and acceleration are read by a gyroscope. By comparing the data of the gyroscope and the data of the accelerometer, more accurate values are obtained. The computing control unit judges the position and direction, and adjusts the phase of the antenna in the open-loop mode, so that the phase of the antenna is tracked faster, but the gain of the antenna is not necessarily the maximum gain because it has not been finely adjusted.

An embodiment of the present disclosure further provides an antenna system including an antenna and the control device for an antenna as described in any one of the preceding embodiments.

An embodiment of the present disclosure further provides a control method for an antenna, including steps of:

receiving position information and temperature information of an antenna, and determining position information of a satellite; and adjusting phases of multiple antenna array elements according to the position information and the temperature information of the antenna, the position information of the satellite and pre-stored calibration data.

In an exemplary embodiment, the control method further includes:

computing a gain of an intermediate signal, determining whether the gain of the intermediate signal is less than or equal to a first gain threshold, and finely adjust the phases of the multiple antenna array elements if the gain is less than or equal to the first gain threshold.

In an exemplary embodiment, the pre-stored calibration data includes multiple sets of test data, wherein each set of test data includes a correspondence between one set of emission source positions, the temperature of the antenna, and a phase calibration value of the antenna.

The step of adjusting the phases of the multiple antenna array elements according to the position information and the temperature information of the antenna, the position information of the satellite and the pre-stored calibration data includes:

determining a corresponding emission source position in the calibration data according to the position information of the antenna and the position information of the satellite;

determining a corresponding set of test data according to the corresponding emission source position and the temperature information of the antenna; and adjusting the phases of the multiple antenna array elements according to the corresponding test data.

In an exemplary embodiment, the satellite is located at a position C and the antenna is located at a position B2. The step of determining the corresponding emission source position in the calibration data according to the position information of the antenna and the position information of the satellite includes:

taking a longitudinal first straight line segment from the position C, and taking a transverse second straight line segment from the position B2, wherein the first straight line segment and the second straight line segment intersects at a position A2;

determining a position A1 on a straight line CA2 with a distance from the position C being equal to a calibration plane height, wherein the calibration plane height is equal to a distance between a plane at which multiple emission sources are located and the position of the antenna during the calibration; and taking a transverse third straight line segment from the position A1, the third straight line segment and a straight line CB2 intersects at a position B1, then the position B1 is the corresponding emission source position in the calibration data.

In an exemplary embodiment, the computing control unit is a field programmable gate array (FPGA) chip.

All related contents of the steps involved in the above method embodiment may be referred to the functional description of the above functional modules, and will not be repeated here.

An embodiment of the present disclosure further provides a computing control device, including a memory and a processor. The memory is configured to store program instructions and calibration data. The processor is configured to call the program instructions stored in the memory and execute the following steps according to the obtained program: receiving position information and temperature information of an antenna and determining position information of a satellite; and adjusting phases of multiple antenna array elements according to the position information and the temperature information of the antenna, the position information of the satellite and pre-stored calibration data.

The memory may store computer programs and data, which may include a high-speed random access memory, and may further include a non-volatile memory, such as a disk storage device, a flash memory device, etc. It may also be a read-only memory (ROM) or other types of static storage devices that may store static information and instructions, a random access memory (RAM) or other types of dynamic storage devices that may store information and instructions. It may also be, but is not limited to, a one-time programmable (OTP) memory, an electrically erasable programmable read-only memory (EEPROM), a magnetic disk storage media or another magnetic storage device, or any other medium capable of carrying or storing program code in the form of instructions or data structures and accessible by a computer. The memory may exist independently and be connected to the processor through a communication line. The memory may also be integrated with the processor.

An embodiment of the present disclosure further provides a computer-readable storage medium, which stores program instructions and calibration data, wherein when the program instruction is executed, the following steps may be implemented: receiving position information and temperature information of an antenna, and determining position information of a satellite; and adjusting phases of multiple antenna array elements according to the position information and the temperature information of the antenna, the position information of the satellite and pre-stored calibration data.

Exemplary, the computer-readable storage medium may include, but is not limited to, a magnetic storage device (e.g. hard disk, floppy disk, magnetic tape, etc.), an optical disk (e.g. CD (Compact Disk), DVD (Digital Versatile Disk), a smart card, and a flash memory device (e.g. EPROM (Erasable Programmable Read-Only Memory), a card, a stick, or a key driver, etc.). The various computer-readable storage media described herein may represent one or more devices and/or other machine-readable storage media for storing information. The term "machine-readable storage medium" may include, but is not limited to, wireless channels and various other media capable of storing, containing, and/or carrying instructions and/or data.

Some embodiments of the present disclosure further provide a computer program product. The computer program product includes computer program instructions that, when executed on a computer, cause the computer to perform one or more steps in the control method for an antenna as described in the above embodiments.

Some embodiments of the present disclosure further provide a computer program. When the computer program is executed on the computer, the computer program causes the computer to perform one or more steps in the control method for an antenna as described in the above embodiments.

The advantages of the computer-readable storage medium, the computer program product and the computer program described above are the same as those of the control method for an antenna described in some of the above embodiments and will not be repeated here.

The accompanying drawings in the present disclosure only relate to the structures related to the present disclosure, and other structures may refer to a general design. The embodiments in the present disclosure, i.e., features in the embodiments, may be combined with each other to obtain new embodiments if there is no conflict.

Those of ordinary skills in the art should understand that modification or equivalent replacement may be made to the technical solutions of the present disclosure without departing from the spirit and the scope of the technical solutions of the present disclosure, and should all fall within the scope of the claims of the present disclosure.

The invention claimed is:

1. A control device for an antenna, wherein the antenna comprises a plurality of antenna array elements and a plurality of phase shifters for calibrating phases of the plurality of antenna array elements, the control device comprises a temperature sensor, a positioning unit and a computing control unit, the temperature sensor is configured to acquire temperature information of the antenna and output the temperature information to the computing control unit;

the positioning unit is configured to acquire position information of the antenna and output the position information to the computing control unit; and the computing control unit is configured to receive the position information and the temperature information of the antenna, determine position information of a satellite based on the position information of the antenna or pre-stored position information of the satellite, and control the phase shifters to adjust phases of the plurality of antenna array elements according to the position information and the temperature information of the antenna, the position information of the satellite and pre-stored calibration data;

wherein the pre-stored calibration data comprises a plurality of sets of test data, and each set of test data comprises a correspondence between one set of emission source positions, the temperature of the antenna, and a phase calibration value of the antenna;

wherein controlling the phase shifters to adjust the phases of the plurality of antenna array elements according to the position information and the temperature information of the antenna, the position information of the satellite and the pre-stored calibration data comprises: determining a corresponding emission source position in the calibration data according to the position information of the antenna and the position information of the satellite; determining a corresponding set of test data according to the corresponding emission source position and the temperature information of the antenna; and controlling the phase shifters to adjust the phases of the plurality of antenna elements according to the corresponding set of test data;

wherein the satellite is located at a position C and the antenna is located at a position B2, and determining the corresponding emission source position in the calibration data according to the position information of the antenna and the position information of the satellite comprises: taking a longitudinal first straight line segment from the position C, and taking a transverse second straight line segment from the position B2, wherein the first straight line segment and the second straight line segment intersect at a position A2; determining a position A1 on a straight line CA2 with a distance from the position C being equal to a calibration plane height, wherein the calibration plane height is equal to a distance between a plane at which a plurality of emission sources are located and the position of the antenna during calibration; and taking a transverse third straight line segment from the position A1, wherein the third straight line segment and a straight line CB2 intersect at a position B1, then the position B1 is the corresponding emission source position in the calibration data.

2. The control device according to claim 1, further comprising a coupler and a signal processing unit;
wherein the coupler is configured to output a signal received by the antenna to the signal processing unit;
the signal processing unit is configured to process the signal received by the antenna to obtain an intermediate signal; and
the computing control unit is further configured to compute a gain of the intermediate signal, determine whether the gain of the intermediate signal is less than or equal to a first gain threshold, and control the phase shifters to finely adjust the phases of the plurality of antenna array elements if the gain is less than or equal to the first gain threshold;
wherein when the gain of the intermediate signal is greater than or equal to the first gain threshold, an azimuth angle of a main lobe of the antenna is aligned with the satellite and the gain is maximized.

3. The control device according to claim 2, wherein the coupler is a power divider or a microstrip line coupled to a receiving link, the receiving link connects the antenna to an external receiving terminal, one end of the microstrip line is connected to a ground resistance, and the other end of the microstrip line is connected to the signal processing unit.

4. The control device according to claim 3, wherein the microstrip line has a periodic cosine or sinusoidal structure.

5. The control device according to claim 2, wherein the signal processing unit comprises a filter, a mixer, and an analog-to-digital converter;

the filter is configured to filter the signal received by the antenna;
the mixer is configured to mix an output signal of the filter with a signal provided by a local oscillator; and
the analog-to-digital converter is configured to perform analog-to-digital conversion on an output signal of the mixer to generate the intermediate signal.

6. The control device according to claim 1, further comprising at least one of a heating module and a cooling module; wherein
the computing control unit is further configured to determine a calibration temperature of the antenna according to a temperature of the antenna, and control at least one of the heating module and the cooling module to adjust the temperature of the antenna to the determined calibration temperature when the temperature of the antenna is not the determined calibration temperature;
the heating module is configured to heat the antenna under control of the computing control unit; and
the cooling module is configured to cool the antenna under control of the computing control unit.

7. The control device according to claim 1, wherein the computing control unit is a field programmable gate array (FPGA) chip.

8. An antenna system, comprising an antenna and the control device for an antenna according to claim 1.

9. A control method for an antenna, wherein the antenna comprises a plurality of antenna elements and a plurality of phase shifters for calibrating phases of the plurality of antenna elements, and the control method comprises:
receiving position information and temperature information of an antenna, and determining position information of a satellite based on the position information of the antenna or pre-stored position information of the satellite; and
adjusting phases of a plurality of antenna array elements according to the position information and the temperature information of the antenna, the position information of the satellite and pre-stored calibration data;
wherein the pre-stored calibration data comprises a plurality of sets of test data, and each set of test data comprises a correspondence between one set of emission source positions, the temperature of the antenna, and a phase calibration value of the antenna;
wherein controlling the phase shifters to adjust the phases of the plurality of antenna array elements according to the position information and the temperature information of the antenna, the position information of the satellite and the pre-stored calibration data comprises: determining a corresponding emission source position in the calibration data according to the position information of the antenna and the position information of the satellite; determining a corresponding set of test data according to the corresponding emission source position and the temperature information of the antenna; and controlling the phase shifters to adjust the phases of the plurality of antenna elements according to the corresponding set of test data;
wherein the satellite is located at a position C and the antenna is located at a position B2, and determining the corresponding emission source position in the calibration data according to the position information of the antenna and the position information of the satellite comprises: taking a longitudinal first straight line segment from the position C, and taking a transverse second straight line segment from the position B2, wherein the first straight line segment and the second straight line segment intersect at a position A2; determining a position A1 on a straight line CA2 with a distance from the position C being equal to a calibration plane height, wherein the calibration plane height is equal to a distance between a plane at which a plurality of emission sources are located and the position of the antenna during calibration; and taking a transverse third straight line segment from the position A1, wherein the third straight line segment and a straight line CB2 intersect at a position B1, then the position B1 is the corresponding emission source position in the calibration data.

10. A computing control device, comprising a memory and a processor, wherein the memory is configured to store program instructions and calibration data; the processor is configured to invoke the program instructions stored in the memory and execute the method according to claim 9.

11. A non-transitory computer-readable storage medium, which stores program instructions and calibration data, wherein when the program instruction is executed, the method according to claim 9 is implemented.

* * * * *